Aug. 31, 1954 K. SCHLESINGER 2,688,086

TELEVISION TUNER

Filed July 10, 1948 3 Sheets-Sheet 1

INVENTOR.
Kurt Schlesinger,
BY
Norman L. Mueller
Atty.

Aug. 31, 1954 K. SCHLESINGER 2,688,086

TELEVISION TUNER

Filed July 10, 1948 3 Sheets-Sheet 2

INVENTOR.
Kurt Schlesinger,
BY
Foorman L. Mueller
Atty.

INVENTOR.
Kurt Schlesinger,
BY
Foorman L. Mueller
Atty.

Patented Aug. 31, 1954 2,688,086

UNITED STATES PATENT OFFICE 2,688,086

TELEVISION TUNER

Kurt Schlesinger, Maywood, Ill., assignor to Motorola, Inc., Chicago, Ill., a corporation of Illinois Application July 10, 1948, Serial No. 38,081

6 Claims. (Cl. 250—40)

This invention relates generally to tuners and more particularly to a tuning system for television receivers which covers a wide range of frequency and provides substantially constant band width throughout this range.

The presently assigned television channels cover a wide range of frequencies from 44 megacycles to over 200 megacycles. These frequencies are not in one continuous band but are in two non-contiguous bands. In television receivers it is necessary that the tuned circuits have adequate band width (about 4 megacycles) so that the entire video and audio signals are received without substantial attenuation. It is desired that the band width be constant throughout the entire tuning range and that the gain be constant over each band and over the entire range. In present receivers two types of tuners are being used, one in which inductance or capacity components are switched to provide circuits tuned to a plurality of channels and a second in which the selective circuits are continuously tunable throughout each of the two ranges. The present invention relates to tuners of the latter type and is directed to providing a simplified and more efficient variable capacity tuner of this type.

It is, therefore, an object of the present invention to provide a tuner continuously variable throughout a wide range and having substantially constant selectivity throughout the range.

Another object of this invention is to provide a circuit tunable throughout a wide range of frequencies in which the Q of the circuit is substantially proportional to the frequency.

A further object of this invention is to provide a tuner which is capable of operation through two non-contiguous frequency ranges and in which the gain is substantially constant for all frequencies in said ranges.

A still further object of this invention is to provide a tuner in which all frequencies in two non-contiguous ranges can be selected by a single control.

Still another object of this invention is to provide a compact tuner in which a relatively few components are required for tuning to all frequencies in the two television frequency ranges.

A feature of this invention is the use of series-tuned circuits in a television receiver with series damping resistors being used so that the band width is constant throughout the tuning range.

A further feature of this invention is the provision of a plurality of series-tuned circuits in which primary and secondary coupling can be selectively used to provide substantially uniform gain throughout a range of frequencies.

A still further feature of this invention is the provision of a tuner including variable condensers and two sets of inductors for operation in two non-contiguous ranges and in which the inductors are automatically switched as the condensers are operated in various sectors.

Further objects, features and advantages will be apparent from a consideration of the following description taken in connection with the accompanying drawings in which.

Figure 8:
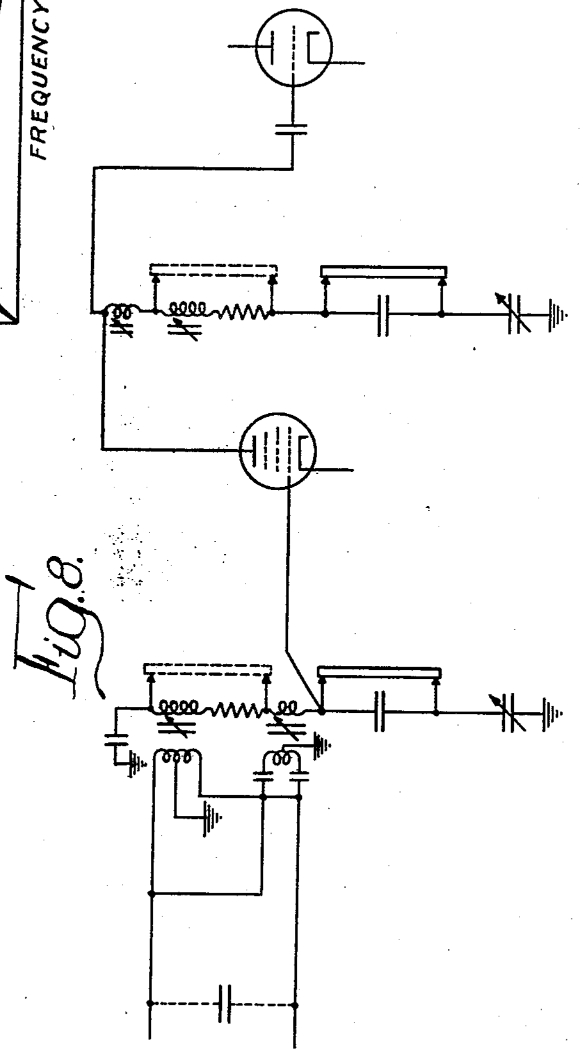
Figures 4, 7:
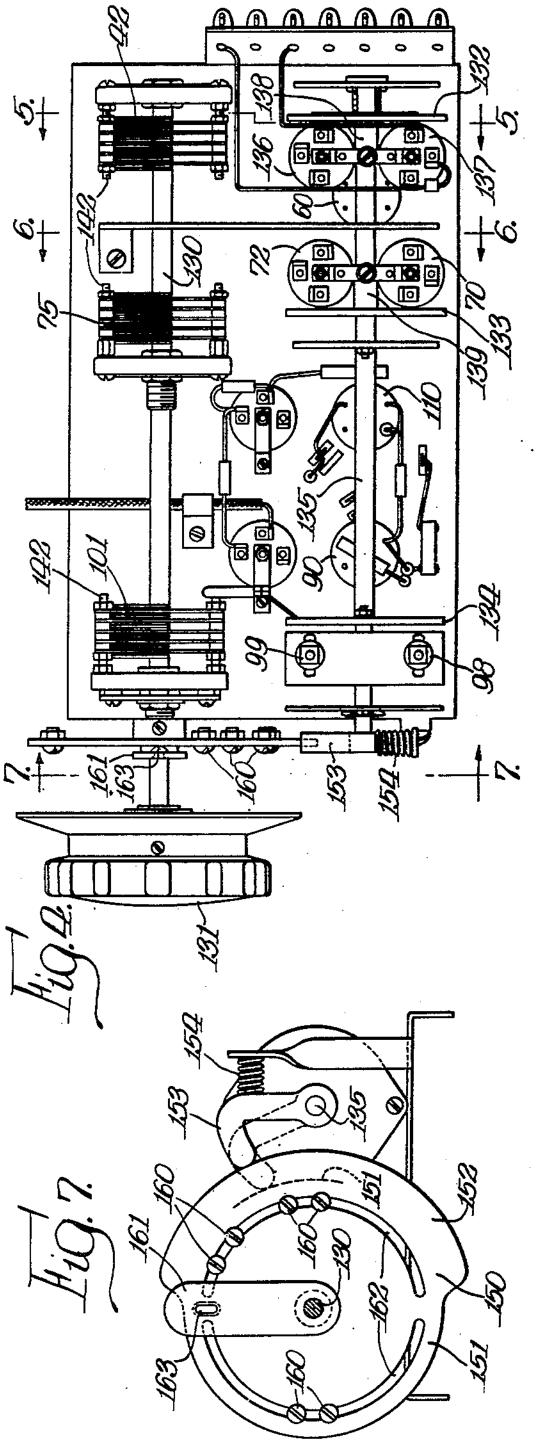
Fig. 4 is a top plan view of a tuner structure in accordance with the invention.
Figure 5:
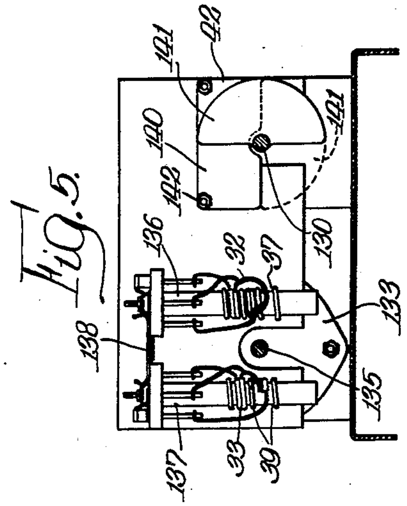
Figure 6:
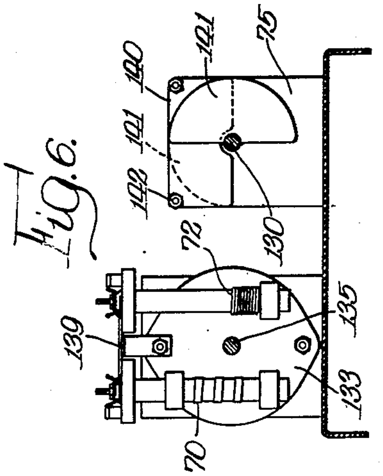

Figs. 5, 6 and 7 are cross-sectional views along the lines 5—5, 6—6 and 7—7, respectively, of Fig. 4; and Fig. 8 illustrates a modified circuit in accordance with the invention.

In practicing the invention there is provided a tuner for a television receiver including resonant circuits for tuning the antenna, radio frequency amplifier, and oscillator. The circuits used are series resonant with the inductor and capacitor in series. Included is a critical series resistor so that the band width is substantially constant throughout the range of frequencies to be tuned. The tuner operates through two non-contiguous frequency ranges being arranged for operation in the two ranges by the switching of inductors and capacitors in the circuits. The same variable condensers are used for tuning in both ranges and a mechanical arrangement is provided so that when the rotors of the condensers are in one sector the components are switched for operation in one range and when the condenser rotors are in a second sector the components are connected properly for operation in the other frequency range. In this way continuous tuning through the two frequency ranges is provided by use of a single control. Various gain characteristics may be obtained from the series resonant circuits by use of primary or secondary coupling thereto. In order to keep the gain of the system substantially constant throughout the frequency ranges, various types of coupling can be used in the different stages.

Figure 1:
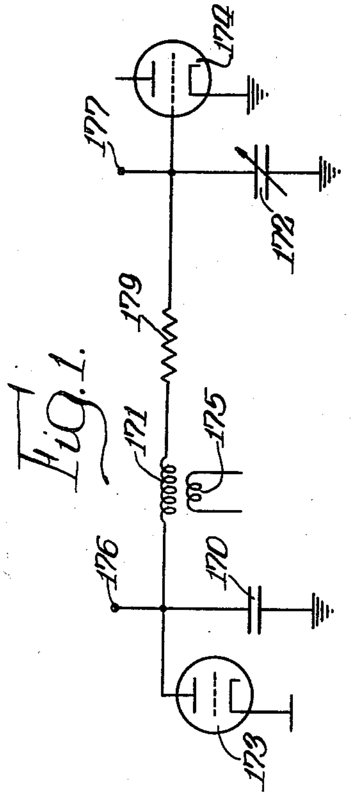
Fig. 1 illustrates the basic circuit of the tuner in accordance with the invention.

In order to provide a television receiver which is continuously tunable over a wide range of frequencies, various factors must be considered. The principal factors are the range of frequencies to be tuned, the band width of the tuner throughout the range, and the gain of the tuner throughout the range. Let us now consider a simple series-tuned circuit as might be utilized in a television receiver. In Fig. 1 there is illustrated a series resonant circuit including a primary condenser 170, inductor 171, and a second condenser 172. This circuit may be used in various tuning systems and the components of the system connected to the circuit will alter the effective values of the circuit elements. For example, if the circuit is used to couple a tube 173 of one stage, to a tube 174 of the next stage, the plate capacity of the tube 173 is effectively connected in parallel with the condenser 170, and the grid capacity of the tube 174 is effectively connected in parallel with the condenser 172.

In such a series circuit the inductor 171 may be of relatively large value even for use at very high frequencies. This is because in series with the tuning capacitor 172 there is the primary capacitor 170 and perhaps also the plate capacity of the tube 173. Above the resonant frequency of this circuit the inductor 171 and variable capacitor 172 behave like a variable tuning inductance which resonates with the capacitor 170. The actual value of the inductor 171, however, is much larger than this effective variable tuning inductance so that it is practicable even at very high frequencies to use relatively large coils of the slug tuned type. That is, the inductor 171 is of much larger value than the inductor of a parallel tuned circuit or a permeability tuned circuit operating at these frequencies would be. In addition to making the construction of the inductors much more simple, this circuit permits the use of damping resistors of a practical size as will be more fully set forth.

Signals can be introduced into the series resonant circuit by inductive coupling to the inductor 171, as by inductor 175, or by applying a signal across condenser 170, as by the tube 173. The output signal may be derived from the circuit by primary coupling at terminal 176 or by secondary coupling at terminal 177. It is well known that the range of frequencies through which this circuit may be tuned is determined by the value of the condenser 170. It is also known that the band width of such a resonant circuit depends upon the damping of the circuit. The band width of a circuit having parallel damping is determined by the formula $$b=\frac{2\pi L f^2}{R}$$

where $b$ is the band width, L is the inductance of the circuit, R is the parallel damping resistance, and $f$ is the frequency. Parallel damping R, therefore, provides band width which is proportional to the frequency squared and this is undesirable in a television receiver as for satisfactory reception the band width should be constant throughout the frequency range.

The band width where series damping is used is $$b=\frac{R}{2\pi L}$$

where $b$ is the band, R the series damping resistance, and L the inductance of the circuit. By providing series damping the band width of the circuit is independent of the frequency range and, for this reason, a series damping resistor 179 is provided. The value of the resistance ($R=2\pi bL$) depends upon the value of the inductance of the circuit and as the inductance is relatively large as previously stated, the resistance will be of a practical value. The resistance of the wiring of the circuit must be considered as a part of the damping resistance and what additional resistance is required can be provided as a separate element. A series damped circuit also has the advantage that the Q of the circuit is proportional to frequency which is advantageous as a high Q is provided at the high frequencies where maximum gain is desired.

It can be shown that the gain characteristics of the series resonant circuit depend upon the manner of output coupling to the circuit. The general formula for the gain obtained by primary coupling as at terminal 176 is as follows:

$$G_p=K\frac{C_s}{C_p[C_p+C_s]}$$

In this formula $G_p$ is the gain, K is a constant, $C_s$ is the secondary capacity, and $C_p$ is the primary capacity.

$$K=\frac{g_m}{2\pi b}$$

Figure 2:
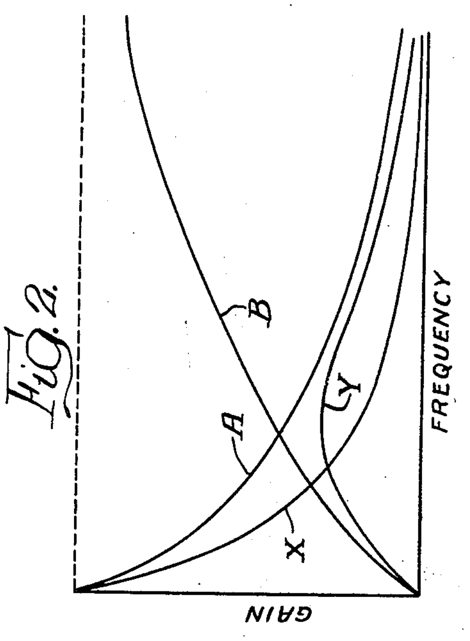
Fig. 2 is a curve chart illustrating the operating characteristics of the tuning system.

($g_m$ is transconductance.) The value of K is of the order of 135 micromicrofarads for a 6AG5 type tube and 6 megacycle band width. The primary capacity must, of course, include the plate capacity of the tube 173 when a tube is coupled to the circuit in the manner shown in Fig. 6. In some instances the tube capacity may be sufficient in itself and additional external capacity may not be required. In the event that the output is applied to the grid of a tube, the grid capacity of this tube must also be added to the primary capacity. The tuning characteristics of this coupling when $C_s$ is varied and $C_p$ is fixed are shown by curve A in Fig. 2.

Different gain-frequency response can be provided by the use of secondary coupling, that is, by coupling to the terminal 177. The gain under these conditions is measured by the formula:

$$G_s=K\frac{1}{C_p+C_s}$$

Here K is the same constant as for primary coupling, but the values of $C_p$ and $C_s$ will, of course, depend upon the system in which the circuit is used with tube capacities being necessarily added if they are present. The tuning characteristics of such coupling are shown by curve B where again $C_s$ is varied and $C_p$ fixed.

It is to be noted that the secondary condenser 172 is variable to tune the resonant circuit through a range of frequencies. However, when a tube or other capacity is provided in parallel with the condenser 172 this capacity must be added to the variable capacity and is effective to reduce the tuning range. The damping resistance which is required to provide the necessary band width may be present in the other elements of the circuit such as the inductor and, therefore, in certain cases a separate resistor may not be required. However, series resistance of the value $R_s=2\pi bL$ is required to maintain constant band width in all cases.

Figure 3:
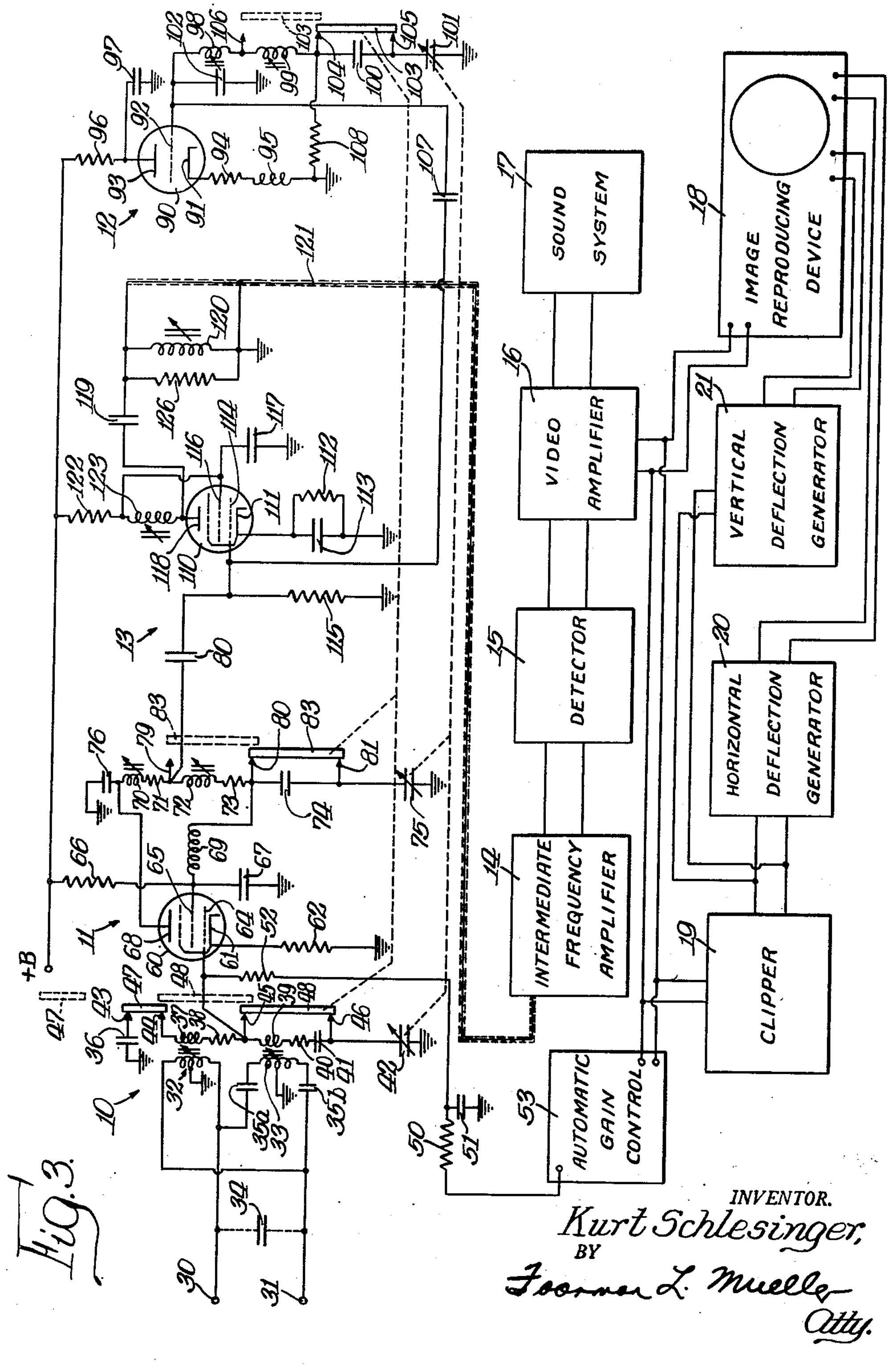
Fig. 3 illustrates the use of the tuner in a television receiver.

In order to provide the over-all gain characteristics desired in a receiver circuit, couplings of different types can be used in the various stages so that the gain characteristics of the various stages will complement each other. If, for example, primary coupling is used in both the antenna and radio frequency amplifier circuits of a receiver the gain-frequency characteristic would be as indicated by curve X in Fig. 2. In Fig. 3 there is illustrated a television receiver circuit in which primary coupling is used in the antenna circuit and secondary coupling is used in the radio frequency amplifier in one frequency band and secondary coupling is used in the antenna circuit and primary coupling is used in the radio frequency amplifier circuit in a different frequency band. In Fig. 8 there is illustrated a similar circuit in which secondary coupling is used in the antenna circuit and primary coupling is used in the radio frequency amplifier circuit in both frequency bands. This will provide a curve having characteristics such as illustrated by curve Y of Fig. 2 in which the response is fairly uniform throughout a very wide frequency range. As single tuned circuits are used in both the antenna circuit and the radio frequency amplifier, a double tuned band pass filter may preferably be provided at the output of the converter to provide a more linear band pass characteristic and a flat signal for the intermediate frequency amplifier.

It will be apparent that the use of such wide band series tuned circuits will be ideally suited for use in receivers where a large number of tuned radio frequency stages are provided. By using various couplings in the stages, the gain characteristics can be made to supplement each other to provide substantially constant gain over a wide tuning range.

It is apparent from the above that a tuning system has been provided in which continuous wide band tuning can be accomplished over a relatively large range of frequencies. The band width is independent of frequency and, therefore, a wide band may be provided through a range of frequencies as required for satisfactory television tuning. The output coupling of the circuit can be selected to provide various gain characteristics and by using combinations of different types of couplings, great latitude is provided as to the over-all gain characteristics.

In Fig. 3 there is illustrated a television receiver system including a tuner in accordance with the invention with the components of the receiver other than the tuner being illustrated in block diagram. The tuner includes a tunable antenna coupling system 10, a radio frequency amplifier 11 having a tuned output circuit, a tunable oscillator 12, and a mixer or first detector 13 in which the radio frequency signals are reduced to intermediate frequency. The intermediate frequency signals are amplified in intermediate frequency amplifier 14 and the video and intercarrier sound signals derived therefrom by detector 15. The video and intercarrier sound signals are amplified in the video amplifier 16 where the signals are separated, with the sound signals being applied to a sound system 17 and the video signal being applied to image reproducing device 18 and clipper 19. The synchronization signals are derived from the video signal in clipper 19 and the horizontal and vertical synchronization signals separated and applied respectively to horizontal deflection generator 20 and vertical deflection generator 21. The deflection generators provide scanning currents or voltages as the case may be for deflecting the beam of the image reproducing device 18, with the generators being held in synchronization by the pulses derived by clipper 19. The components shown in block diagram may all be of standard construction and may operate in the standard manner so that description thereof is not believed to be necessary.

In-coming signals from a suitable antenna are applied to the terminals 30 and 31 of the antenna coupling system 10 which includes closely coupled bifilar coils 32 and 33. The coil 32 is used for coupling the antenna to the system in the low frequency television band and has a center tap which is connected to ground. The capacitance of the leads, indicated by condenser 34, will in general be sufficient for tuning the coil 32. The coil 33 is used for coupling the antenna on the high frequency television band and is of much smaller inductance than the coil 32. Condensers 35*a* and 35*b* are connected in series with the coil 33 across the terminals 30 and 31. A single condenser could be used but by using identical condensers on each side of the coil 33, the center point on the coil can be grounded. Such a coupling system has two resonant frequencies at which the current through one of the inductances is a maximum. The low frequency resonant point is reached when coil 33 and condensers 35*a* and 35*b* in series act like a capacitance smaller than that of the condensers and this capacitance together with capacitor 34 resonants with inductor 32. The high resonant point occurs when coil 33 and condensers 35*a* and 35*b* act like an inductance larger than the coil 33 alone and this inductance together with inductor 32 resonants with capacitor 34. By properly designing the circuit the coils 32 and 33 can be made to resonant at the middle of the two television bands and, therefore, the circuit functions as a switch coupling the coils 32 and 33 to the antenna on the low and high bands respectively.

The antenna coupling circuit is tuned by a series resonant circuit, including condenser 36, inductor 37, resistor 38, inductor 39, resistor 40, condenser 41 and variable condenser 42. Contacts 43, 44, 45 and 46 are provided for selectively connecting the various components in series. Movable contacts 47 and 48 are arranged to connect condenser 36 and to short out inductor 39, resistor 40 and condenser 41 when reception on the low frequency band is desired. The contacts 47 and 48 may be moved so that the contact 48 bridges contacts 44 and 45 to short out inductor 37 and resistor 38 when reception on the high frequency band is desired. The coils 37 and 39 are inductively coupled to the coils 32 and 33, respectively, and include movable iron cores for varying the inductance thereof.

A coupling system is provided for applying automatic gain control voltages to the antenna circuit including resistor 50, condenser 51 and resistor 52. A variable biasing voltage may be applied thereto from automatic gain control 53 wherein the voltage may be produced in any one of a number of well known ways.

It is seen from the above that for operation on the low frequency band, the tuning circuit includes condenser 36, inductor 37, resistor 38 and variable condenser 42. Resistor 38 may be omitted in some instances as sufficient resistance is provided by the other circuit elements. Change of the capacity of the variable condenser 42 tunes the series resonant circuit through a band of frequencies and the series damping resistor 38 is effective to produce substantially constant band width throughout the band of frequencies as will be more fully described. The output from the series resonant circuit is taken across condenser 42 to provide secondary coupling with the result that the gain will vary directly with frequency. For operation in the high frequency band the tuning circuit will include inductor 39, resistor 40, condenser 41 and variable condenser 42. The inductance of movable contact 48 must be very low as the inductance for the high band circuit is very low. Primary coupling is used and the grid-cathode capacity of the tube 60 provides the primary capacity of the series circuit. The damping resistance required to maintain constant band width at the high frequencies is very small and is provided by resistor 40. Varying the capacity of condenser 42 is effective to tune the circuit through the required range. As primary coupling is used in the high frequency range, the gain of the antenna circuit will vary inversely with the frequency.

The radio frequency amplifier 11 includes a pentode tube 60 including a cathode 61, a control grid 64, screen grid 65 and plate 68. The signal from the antenna circuit is applied to the control grid 64. The cathode 61 is biased by resistor 62, and the screen grid 65 is connected to +B potential through resistor 66 by-passed by condenser 67. The plate 68 is connected to an output circuit which includes condenser 76, inductor 70, resistor 71, inductor 72, resistor 73, condenser 74 and variable condenser 75 which form a series resonant circuit. Condensers 75 and 76 are connected to ground, and the junction of resistor 73 and condenser 74 is connected to screen 65 through an inductor 69. Contacts 79 to 81 are adapted to be interconnected by movable contact 83 for selectively shorting out certain of the components of the series resonant circuit. For operation on the low frequency band, movable contact 83 interconnects the contacts 80 and 81 to short out condenser 74. The resonant circuit then includes the capacity of tube 60 and condenser 76 in parallel, inductor 70, resistor 71, inductor 72, resistor 73 and variable condenser 75. The inductor 70 is very small compared to the inductor 72 so that for operation on the low frequency band the inductor 70 may be neglected. Resistors 71 and 73 provide the series damping resistance so that the band width is substantially constant. The output for the low frequency band is in effect taken across the tube 60 so that primary coupling is actually used.

For operation in the high frequency band the movable contact 83 bridges the contacts 79 and 80 so that the resonant circuit includes the capacity of tube 60 and condenser 76 in parallel, inductor 70, resistor 71 and condensers 74 and 75. For operation at the high frequency band the inductor 70 provides the entire inductance of the resonant circuit. As in the antenna switch, the inductance of the contact 83 must be very low. Coupling is taken across condensers 74 and 75 in series so that secondary coupling is provided.

For providing a variable frequency signal for reducing the frequency of the received radio frequency signal, the oscillator 12 is provided. This oscillator includes a triode valve 90 having a cathode 91, grid 92 and plate 93. The cathode is grounded through resistor 94 and inductor 95 and the plate is connected to +B potential through resistor 96. A high frequency by-pass is provided by the condenser 97. The grid 92 is connected in a series resonant circuit including inductor 98, inductor 99, condenser 100 and variable condenser 101. Resistor 103 provides bias for the grid 92. A condenser 102 is connected in shunt with the grid capacity of the tube 90 to increase the tuning range. For operation in the low frequency band the condenser 100 is shorted by movable contact 103 which bridges contacts 104 and 105. The variable condenser 101 is used to tune the oscillator through the desired frequency range for reception on the low frequency television band. For operation on the high frequency band the inductor 99 is shorted and condenser 100 is connected in series with variable condenser 101. The change of capacity of condenser 101 is also effective for varying the frequency of the oscillator through the range of frequencies required for operation on the high frequency band.

The output of the oscillator 12 is applied through coupling condenser 107 to the mixer 13. The mixer includes a pentode 110 having a cathode 111, a control grid 114, a screen grid 116 and a plate 118. The cathode is biased by resistor 112, by-passed by condenser 113, and the grid 114 to which the signals from the radio frequency amplifier 11 and the oscillator 12 are applied is biased by resistor 115. The screen grid 116 of the pentode is connected to the +B potential and by-passed by condenser 117. The plate 118 is connected through condenser 119 to the tuned circuit including inductor 120 and resistor 126. The plate is also tuned by the inductor 123. For providing operating potentials to the plate 118 inductor 123 is connected in series with resistor 122 to +B. The inductors 120 and 123 may be tuned to the edges of the intermediate frequency band by movable iron cores to thereby provide a double tuned converter system. This double tuned system compensates for the single tuned antenna and radio frequency amplifier circuits to provide a flat signal with very sharp sides for the intermediate frequency amplifier. The intermediate frequency signal is taken across the inductor 120 and applied through a coaxial transmission line 121 to the intermediate frequency amplifier 14.

The physical structure of the tuner is shown in Figs. 4 to 7, inclusive. In Fig. 4 the three tuning condensers 42, 75 and 101 are connected by a single shaft 130 to which is secured a control knob 131. The switch includes three levels or wafers 132, 133 and 134 which include movable contacts similarly connected by a single shaft identified as 135. The coils 32 and 37 of the antenna circuit may be mounted on a single form 136 best shown in Fig. 5. Similarly coils 33 and 39 are mounted on a form 137. The forms 136 and 137 are supported by bracket 138 secured to the wafer 132. The coils 32, 33, 37 and 39 are connected to contacts on the wafer 132 adapted to be selectively interconnected in the manner illustrated in Fig. 3. The construction of the wafer, contacts, and the movable contacts for interconnecting the same can be in accordance with standard practice. The coils 70 and 72 of the radio frequency amplifier circuit are provided on individual forms which are supported by bracket 139 secured to the wafer 133 and are electrically connected to contacts thereof to provide the switching illustrated in Fig. 3. Fig. 6 shows the details of this construction. Coils 98 and 99 of the oscillator circuit are mounted on wafer 134 and are arranged to be switched in the manner illustrated in Fig. 3.

The condensers 42, 75 and 101 include fixed plates 140 and movable plates 141. As best illustrated in Figs. 5 and 6, the fixed plates are mounted by bolts 142 in positions above the shaft 130 which supports the movable plates. The shaft need not insulate the various condensers as one terminal of each is grounded as shown in Fig. 3. Therefore, the maximum capacity is provided when the movable plates are in the uppermost position as shown in dotted lines in Fig. 6. The minimum capacity will obviously be when the plates are in the lowermost position as shown in dotted lines in Fig. 5. It will then be apparent that as the plates are rotated from the position of maximum capacity (Fig. 6) in a clockwise direction all values between maximum and minimum will be passed through until the position of Fig. 5 is reached. If the rotation is continued, the condensers will go from the minimum to the maximum value as they are rotated clockwise to the position of Fig. 6. Therefore, it will be seen that all values are passed through twice during a complete revolution of the shaft on which the movable plates are mounted. Advantage has been taken of this feature to provide a system in which two bands may be tuned with the various frequencies in the two bands spread throughout one complete revolution of the control knob. The band switching can be automatically produced by the control knob for the condensers as will be explained hereinafter.

Interrelation between the movement of shaft 130 on which the movable condenser plates are mounted and the shaft 135 which controls the switches is provided by the mechanism illustrated in Fig. 7. A disc 150 is supported on the shaft 130 having an exterior edge formed of two 180 degree sectors which have different radii. More specifically, the sector 151 is of smaller radius than the sector 152. Bearing against the edge of the disc 150 is a follower 153 secured to the shaft 135. The follower is held against the edge of the disc 150 by compression spring 154. This causes the follower 153 to tend to move in a counterclockwise direction so that when the follower engages the sector 152 of the disc 150, the shaft 135 is in one position and when the disc is rotated so that the follower engages the sector 151, the shaft 135 is rotated counterclockwise to a second position. This rotation of the shaft working through the movable contacts associated with the wafers 132, 133 and 134 provides the switching action illustrated in the circuit diagram of Fig. 3. Therefore, while the shaft 130 is in one 180 degree sector the switches will provide the connection shown in solid lines of Fig. 3 and when the shaft 130 is in the other 180 degree sector the switches will be in the dotted position shown in Fig. 3. Each of the condensers is variable through all values between maximum and minimum while the switch is in each position so that movement of shaft 130 provides continuous tuning through both frequency bands.

In order to provide preset frequencies in each frequency range, stops 160 may be provided on disc 150 which may be engaged by a fixed indexing member 161. The stops 160 may be in the form of small bolts adjustably positioned in slots 162 in the disc 150. The indexing member may then include a ridge 163 which engages the stops 160, and by spacing the two stops which define each position by a small interval, limited movement of the disc in each frequency position is permitted.

Tuners in accordance with the invention have been constructed and found to be highly successful. By using different types of coupling in the various tuned circuits, satisfactory gain characteristics have been obtained over both the high and low frequency television bands. In systems constructed components having the following values were used in the circuit of Fig. 3:

| | |
|---|---|
| Coil 32 | 2¾ turns #29 wire. |
| Coil 33 | 2¼ turns #29 wire. |
| Condenser 35*a* | 5 micromicrofarads. |
| Condenser 35*b* | 5 micromicrofarads. |
| Condenser 36 | 100 micromicrofarads. |
| Coil 37 | 4 turns #18 wire. |
| Resistor 38 | 5 ohms. |
| Coil 39 | 3¼ turns #18 wire. |
| Resistor 40 | 10 ohms. |
| Condenser 41 | 10 micromicrofarads. |
| Condenser 42 (variable) | 4 to 40 micromicrofarads. |
| Resistor 50 | 47,000 ohms. |
| Condenser 51 | 1.5 microfarads. |
| Resistor 52 | 47,000 ohms. |
| Tube 60 | Type 6AG5. |
| Resistor 62 | 47 ohms. |
| Condenser 67 | 250 micromicrofarads. |
| Inductor 69 | 150 turns #38 wire. |
| Inductor 70 | 3½ turns 2 millimeter copper ribbon. |
| Resistor 71 | 5 ohms. |
| Inductor 72 | 9 turns #24 wire. |
| Resistor 73 | 22 ohms. |
| Condenser 74 | 47 micromicrofarads. |
| Condenser 75 (variable) | 4 to 40 micromicrofarads. |
| Condenser 76 | 5 micromicrofarads. |
| Condenser 80 | 8 micromicrofarads. |
| Tube 90 | Type 6C4. |
| Resistor 94 | 150 ohms. |
| Inductor 95 | 40 turns #30 wire. |
| Resistor 96 | 1,500 ohms. |
| Condenser 97 | 250 micromicrofarads. |
| Inductor 98 | 3¼ turns #20 wire. |
| Inductor 99 | 3¾ turns #20 wire. |
| Condenser 100 | 200 micromicrofarads. |
| Condenser 101 (variable) | 6 to 38 micromicrofarads. |
| Condenser 102 | 3 micromicrofarads. |
| Resistor 108 | 8,200 ohms. |
| Tube 110 | Type 6AG5. |
| Resistor 112 | 120 ohms. |
| Condenser 113 | 250 micromicrofarads. |
| Resistor 115 | 1 megohm. |
| Condenser 117 | 250 micromicrofarads. |
| Condenser 119 | 1 micromicrofarad. |
| Inductor 120 | 10 turns #20 wire. |
| Resistor 122 | 2,700 ohms. |
| Inductor 123 | 20 turns #24 wire. |
| Resistor 126 | 8,200 ohms. |

Coils 32 and 33 are closely coupled and must be well insulated. Movable iron cores are provided for tuning inductors 120 and 123.

The mechanical arrangements of the tuning elements provide a compact and relatively inexpensive tuner structure. The tuner is very simple in operation and is effective to tune through two non-contiguous bands without the use of a separate band selector control. It has been stated that the circuits are suitable for use in tuned radio frequency receivers and it will be apparent that the tuner structure can provide tuning of such receivers through two bands by the use of a single control in exactly the same manner as when used in a superheterodyne receiver.

While certain embodiments of the invention have been described which are illustrative thereof, it is apparent that various changes and modifications can be made therein without departing from the intended scope of the invention as defined by the appended claims.

I claim:

1. An electronic wave receiver for operation in the frequency range above 50 megacycles and being adapted to receive a wide band of frequencies, including in combination, a plurality of stages connected in cascade, each of said stages comprising a series resonant circuit tunable to a plurality of frequencies within said range, each of said series resonant circuits including fixed capacitor means, inductor means, adjustable capacitor means for tuning said resonant circuit through said range of frequencies, said resonant circuits having the damping resistance required for holding the bandwidth of response thereof substantially constant throughout said range of frequencies, means for deriving signals from said series resonant circuit of one of said stages across said fixed capacitor means thereof so that the gain of said stage decreases with frequency, and means for deriving signals from said series resonant circuit of another one of said stages across said adjustable capacitor means thereof so that the gain thereof increases with frequency, whereby the gain characteristics of said stages complement each other and the overall gain is substantially uniform throughout said range of frequencies.

2. An electronic wave receiver for operation in the frequency range above 50 megacycles and being adapted to receive a wide band of frequencies including in combination a plurality of stages connected in cascade, each of said stages comprising an electron discharge valve and a series resonant circuit tunable to a plurality of frequencies within said range, each of said series resonant circuits including fixed capacitor means, inductor means, adjustable capacitor means for tuning said resonant circuit through said range of frequencies, said resonant circuits having the damping resistance required for holding the bandwidth of response thereof substantially constant throughout said range of frequencies, means for applying signals from said series resonant circuit of one of said stages from said fixed capacitor means thereof to said valve thereof so that the gain of said stage decreases with frequency, and means for applying signals from said series resonant circuit of another one of said stages from said adjustable capacitor means thereof to said valve thereof so that the gain thereof increases with frequency, whereby the gain characteristics of said stages complement each other and the overall gain is substantially uniform throughout said range of frequencies.

3. An electronic wave receiver for operation in the frequency range above 50 megacycles and being adapted to receive a wide band of frequencies including in combination a plurality of stages connected in cascade, each of said stages comprising an electron discharge valve having input and output electrodes and a series resonant circuit tunable to a plurality of frequencies within said range, each of said series resonant circuits including fixed capacitor means, inductor means, and adjustable capacitor means for tuning said resonant circuit through said range of frequencies, said electron discharge valve of one of said stages being connected to said resonant circuit thereof with the input electrode capacitance thereof forming at least a part of said fixed capacitor means thereof so that signals are applied to said valve which decrease with frequency, said electron discharge valve of another one of said stages being connected to said resonant circuit thereof with the input electrode capacitance forming at least a part of said adjustable capacitor means thereof so that signals are applied to said valve which increase with frequency, said resonant circuits having the damping resistance required for holding the bandwidth thereof substantially constant throughout said range of frequencies, whereby the gain characteristics of said stages complement each other and the overall gain and bandwidth is substantially uniform throughout said range of frequencies.

4. An electric wave receiver for operation on wide band channels in first and second noncontiguous frequency bands in the frequency range above 50 megacycles, including in combination, a plurality of tunable stages connected in cascade, each of said tunable stages including an electron discharge valve having an input terminal, and a plurality of circuit elements including tunable capacitor means, inductor means, and fixed capacitor means, and switching means movable between first and second positions for selectively interconnecting said circuit elements and said input terminal of each stage to provide first and second series resonant circuits in each of said stages tunable to channels in said first and second frequency bands respectively, said switching means in each position thereof connecting said tunable capacitor means of each of said stages and at least portions of said inductor means and said fixed capacitor means thereof in a series resonant circuit which is tuned by said tunable capacitor means, each of said series resonant circuits including therein damping resistance means for holding the bandwidth of the response thereof substantially constant throughout the frequency band thereof, said switching means in each position thereof connecting said connected portion of said fixed capacitor means of one stage to said input terminal of said electron discharge valve thereof so that the gain of said one stage decreases with frequency, and connecting said tunable capacitor means of the other one of said stages to said input terminal of said electron discharge valve thereof so that the gain of said other stage increases with frequency, whereby the gain characteristics of said stages complement each other and the overall gain is substantially uniform in both frequency bands.

5. An electric wave receiver for operation on wide band channels in first and second noncontiguous frequency bands in the frequency range above 50 megacycles, including in combination, first and second tunable stages connected in cascade, each of said tunable stages including an electron discharge valve having an input terminal, and a plurality of circuit elements including tunable capacitor means, inductor means, and fixed capacitor means, and switching means movable between first and second position for selectively interconnecting said circuit elements and said input terminal of each stage to provide first and second series resonant circuits in each of said stages tunable to channels in said first and second bands of frequencies, respectively, said switching means in each position thereof connecting said tunable capacitor means of each of said stages and at least portions of said inductor means and said fixed capacitor means thereof in a series resonant circuit which is tuned by said tunable capacitor means, each of said series resonant circuits including therein damping resistance means for holding the bandwidth of the response thereof substantially constant throughout the frequency band thereof, said switching means in said first position thereof connecting said connected portion of said fixed capacitor means of said first stage to said input terminal of said electron discharge valve thereof so that the gain of said first stage decreases with frequency, and connecting said tunable capacitor means of said second stage to said input terminal of said electron discharge valve thereof so that the gain of said second stage increases with frequency, and said switching means in the second position thereof connecting said tunable capacitor means of said first stage to said input terminal of said electron discharge valve thereof so that the gain of said stage decreases with frequency and connecting said connected portion of said fixed capacitor means of said second stage to said input terminal of said electron discharge valve thereof so that the gain of said second stage increases with frequency, whereby the gain characteristics of said stages complement each other and the overall gain is substantially uniform in both frequency bands.

6. An electric wave receiver for operation on wide band channels in first and second noncontiguous frequency bands in the frequency range above 50 megacycles, including in combination, first and second tunable stages connected in cascade, each of said tunable stages including an electron discharge valves having an input terminal, and a plurality of circuit elements including tunable capacitor means, inductor means, and fixed capacitor means, and switching means movable between first and second position for selectively interconnecting said circuit elements and said input terminal of each stage to provide first and second series resonant circuits in each of said stages tunable to channels in said first and second bands of frequencies, respectively, said switching means in each position thereof connecting said tunable capacitor means of each of said stages and at least portions of said inductor means and said fixed capacitor means thereof in a series resonant circuit which is tuned by said tunable capacitor means, each of said series resonant circuits including therein damping resistance means for holding the bandwidth of the response thereof substantially constant throughout the frequency band thereof, said switching means in said first and second positions thereof connecting said connected portion of said fixed capacitor means of said first stage to said input terminal of said electron discharge valve thereof so that the gain of said first stage decreases with frequency, and connecting said tunable capacitor means of said second stage to said input terminal of said electron discharge valve thereof so that the gain of said second stage increases with frequency, whereby the gain characteristics of said stages complement each other and the overall gain is substantially uniform in both frequency bands.

References Cited in the file of this patent

UNITED STATES PATENTS

| Number | Name | Date |
|---|---|---|
| 1,831,640 | Roberts | Nov. 10, 1931 |
| 1,917,426 | Borias | July 11, 1933 |
| 2,045,910 | Harnett | June 30, 1936 |
| 2,056,955 | Carlson | Oct. 13, 1936 |
| 2,071,902 | Rust | Feb. 23, 1937 |
| 2,082,517 | Rust et al. | June 1, 1937 |
| 2,115,619 | Carpenter | Apr. 26, 1938 |
| 2,226,488 | Clay | Dec. 24, 1940 |
| 2,408,896 | Turner | Oct. 8, 1946 |

FOREIGN PATENTS

| Number | Country | Date |
|---|---|---|
| 371,275 | Great Britain | Apr. 21, 1932 |